United States Patent
Tsukamoto (10) Patent No.: US 10,167,547 B2
(45) Date of Patent: Jan. 1, 2019

(54) GADOLINIUM SPUTTERING TARGET AND PRODUCTION METHOD OF SAID TARGET

(75) Inventor: Shiro Tsukamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 90 days.

(21) Appl. No.: 13/517,208

(22) PCT Filed: Dec. 21, 2010

(86) PCT No.: PCT/JP2010/072965
§ 371 (c)(1),
(2), (4) Date: Jun. 19, 2012

(87) PCT Pub. No.: WO2011/078148
PCT Pub. Date: Jun. 30, 2011

(65) Prior Publication Data
US 2012/0255859 A1    Oct. 11, 2012

(30) Foreign Application Priority Data
Dec. 24, 2009  (JP) .................. 2009-292496

(51) Int. Cl.
| C23C 14/34 | (2006.01) |
| C23C 14/14 | (2006.01) |
| H01J 37/34 | (2006.01) |
| H01J 37/32 | (2006.01) |
| B23K 20/02 | (2006.01) |

(52) U.S. Cl.
CPC ........ *C23C 14/3414* (2013.01); *B23K 20/021* (2013.01); *C23C 14/14* (2013.01); *H01J 37/3255* (2013.01); *H01J 37/3426* (2013.01); *H01J 37/3435* (2013.01)

(58) Field of Classification Search
CPC .. C23C 14/3414; C23C 14/14; H01J 37/3255; H01J 37/3426; H01J 37/3435
See application file for complete search history.

(56) References Cited

U.S. PATENT DOCUMENTS

| 5,693,203 A | 12/1997 | Ohhashi et al. |
| 6,073,830 A | 6/2000 | Hunt et al. |
| 6,274,015 B1 | 8/2001 | Beier et al. |

(Continued)

FOREIGN PATENT DOCUMENTS

| JP | 06-158296 A | 6/1994 |
| JP | 07-278804 A | 10/1995 |

(Continued)

*Primary Examiner* — Jason Berman
(74) *Attorney, Agent, or Firm* — Howson & Howson LLP (57) ABSTRACT

An assembly of a gadolinium target and a titanium backing plate, wherein the gadolinium target-titanium backing plate assembly has a solid-phase diffusion-bonded interface at a bonding interface between the gadolinium target and the titanium backing plate. An object of the present invention is to discover a backing plate that is suitable for the gadolinium sputtering target, explore the optimal bonding conditions, improve the deposition rate, stabilize the sputtering process, and prevent the occurrence of warpage and separation of the target material and the backing plate by increasing the bonding strength between the target material and the backing plate, as well as inhibit the generation of particles during sputtering.

6 Claims, 4 Drawing Sheets

(56) References Cited

U.S. PATENT DOCUMENTS

| | | | |
|---|---|---|---|
| 6,385,295 B1 * | 5/2002 | Van De Vorst et al. | 378/143 |
| 6,759,143 B2 | 7/2004 | Oda et al. | |
| 6,793,124 B1 | 9/2004 | Takahashi et al. | |
| 7,347,353 B2 | 3/2008 | Yamakoshi et al. | |
| 8,157,973 B2 | 4/2012 | Oda et al. | |
| 2005/0167766 A1 | 8/2005 | Yagishita | |
| 2007/0120204 A1 | 5/2007 | Yagishita | |
| 2008/0099937 A1 * | 5/2008 | Sasai et al. | 264/2.7 |
| 2008/0116066 A1 | 5/2008 | Miyashita | |
| 2009/0008245 A1 | 1/2009 | Yamakoshi et al. | |
| 2009/0229975 A1 | 9/2009 | Yamakoshi | |
| 2010/0206724 A1 | 8/2010 | Takahashi | |

FOREIGN PATENT DOCUMENTS

| | | |
|---|---|---|
| JP | H08-279344 A | 10/1996 |
| JP | 10-219446 A | 8/1998 |
| JP | 10-287972 A | 10/1998 |
| JP | H11-045674 A | 2/1999 |
| JP | 2000-123432 A | 4/2000 |
| JP | 2004-154277 A | 6/2004 |
| JP | 2005-203220 A | 7/2005 |

\* cited by examiner

GADOLINIUM SPUTTERING TARGET AND PRODUCTION METHOD OF SAID TARGET

BACKGROUND

The present invention relates to a gadolinium sputtering target bonded to a titanium backing plate, and to a method of producing such a target.

Gadolinium (Gd) is one of the rare-earth elements, and is present in small amounts in xenotime, monazite and the like. Gadolinium is a gray-colored metal having an atomic number of 64 and an atomic weight of 157.3, and possesses a hexagonal close-packed structure at normal temperature. Moreover, gadolinium has a melting point of 1310° C., a boiling point of 3300° C., density of 7.90 g/cm$^3$, resistivity of 141×10$^{-6}$ Ωcm, and magnetic susceptibility of 480×10$^{-6}$ cm$^3$/g. This is a ferromagnetic material at 293 K or less, and has a wide range of application as a raw magnetic material and a raw laser material (refer to The Iwanami's Dictionary of Physics and Chemistry). The linear expansion coefficient of gadolinium is 1.4×10$^{-6}$/K (20° C.).

In recent years, research and development have been conducted to utilize gadolinium (Gd) as an electronic material (thin film), especially as a metal gate electrode of an FET (field-effect transistor), and gadolinium is a metal that is attracting attention.

As a result of combining gadolinium with a high-permittivity insulating film (high-k insulating film), it is possible to maintain the performance of the transistor at a high level while inhibiting leak currents and generation of heat. When a high-permittivity insulating film (high-k insulating film) is combined with a conventional silicon-based gate electrode, fixation of the carrier and depletion of the gate result from the phenomenon called fermi level pinning that occurs at the interface therebetween, and this causes the malfunction of the transistor or the deterioration in the switching performance due to the increase of the threshold voltage.

Normally, the foregoing electronic material is formed via sputtering. Sputtering is a method in which a DC voltage or a high-frequency voltage is applied between a substrate and a sputtering target while introducing inert gas (mainly Ar gas) into a vacuum, the ionized Ar collides with the sputtering target, and the sputtered target material is deposited onto the substrate.

Upon producing a gadolinium (Gd) sputtering target, the gadolinium ingot prepared by melting and casting is cut into a predetermined size, and this is ground and polished and thereafter bonded with a backing plate to obtain a gadolinium target-backing plate assembly. There are several conventional technologies related to the method of producing a gadolinium sputtering target, and the method of bonding the target with the backing plate.

For example, Patent Document 1 describes that a depressed part is formed in the titanium-alloy backing plate body, and a target is embedded therein and bonded to each other. In the foregoing case, used as the target material are a Cu-based material, an In-based material, a Sn-based material, an Ag-based material, and a Ni-based material. The object of Patent Document 1 is to reduce the recycle cost.

Patent Document 2 discloses technology of using a titanium backing plate for a titanium target, and performing mutual diffusion bonding in order to increase the interface adherence.

Patent Document 3 describes a backing plate for a target of ferromagnetic material, particularly in which a high-permeability material is arranged around the target so that magnetic field lines will not leak from the sputtering face. In Patent Document 3, an example of bonding the rare-earth metal Gd as one example among the numerous ferromagnetic materials to an oxygen-free copper backing plate is illustrated. As a special example, Patent Document 3 also discloses an example of bonding this target to a Ti-alloy backing plate.

Patent Document 4 describes an example of using a titanium target that can be applied to high-power sputtering, and particularly discloses a technology in which high-purity titanium as the target and low-purity titanium as the backing plate are used, and the crystal grain size of the backing plate is made to be smaller than that of the target. The object of Patent Document 4 is to prevent target warpage and detachment.

Moreover, Patent Document 5 describes a method of producing a magnetooptical recording medium, wherein a magnetic film containing multiple materials is deposited by simultaneously discharging and sputtering a plurality of targets, and further describes that a Gd target is used as one of such targets. In the foregoing case, a problem in the stability of the discharge will arise and a compositional variation tends to occur in the deposition. Therefore, an alloy target is used as one of the foregoing targets.

Moreover, Patent Document 6 describes a semiconductor device comprising a Schottky source/drain area formed from a metal in a field-effect transistor, and further describes that the gate electrode is configured from one or more silicides selected from a group containing Er, Yb, Y, Gd, Dy, Ho and La. The object of Patent Document 6 is to lower the threshold voltage of the Schottky source/drain transistor. Although Patent Document 6 describes that Gd is effective as a gate electrode, it does not refer to the issues related to the production of a target.

As described above, it should be understandable that the selection of the target material and the backing plate material is important and numerous devisals have been made in order to improve the deposition rate, stabilize the sputtering process for reducing variation in the deposition, increase the bonding strength between the target material and the backing plate, and prevent the occurrence of warpage and separation of the target material and the backing plate. Nevertheless, gadolinium is a rare-earth element, and gadolinium has attracted attention as a ferromagnetic body so recently that there is no specific disclosure on how to overcome the foregoing problems with gadolinium, nor any suggestion as the solution thereof.

[Patent Document 1] Japanese Laid-Open Patent Publication No. H10-287972
[Patent Document 2] Japanese Laid-Open Patent Publication No. H6-158296
[Patent Document 3] Japanese Laid-Open Patent Publication No. H10-219446
[Patent Document 4] Japanese Laid-Open Patent Publication No. H7-278804
[Patent Document 5] Japanese Laid-Open Patent Publication No. 2000-123432
[Patent Document 6] Japanese Laid-Open Patent Publication No. 2005-209782

SUMMARY OF INVENTION

An object of the present invention is to discover a backing plate that is suitable for the gadolinium sputtering target, explore the optimal bonding conditions, improve the deposition rate, stabilize the sputtering process, and prevent the occurrence of warpage and separation of the target material and the backing plate by increasing the bonding strength between the target material and the backing plate, as well as inhibit the generation of particles during sputtering.

In order to achieve the foregoing object, as a result of intense study, the present inventors have discovered that a titanium backing plate is most suitable for a gadolinium sputtering target.

Based on the foregoing discovery, the present invention provides:
1. An assembly of a gadolinium target and a titanium backing plate, wherein the assembly of gadolinium target and titanium backing plate has a solid-phase diffusion-bonded interface at a bonding interface between the gadolinium target and the titanium backing plate.

The present invention additionally provides:
2. A method of producing an assembly of gadolinium target and titanium backing plate, wherein the gadolinium target and the titanium backing plate are subject to solid-phase diffusion bonding under an inert atmosphere at a temperature of 350 to 650° C. and pressure of 1000 to 2000 atm; and
3. A method of producing an assembly of gadolinium sputtering target and titanium backing plate, wherein gadolinium is subject to isothermal forging under an argon atmosphere at a temperature of 1000° C. or less and forging reduction of 60% or higher to prepare a gadolinium ingot, the obtained ingot is sliced to an appropriate thickness to prepare a target material, the surface of the target material is machined as final-finishing treatment, and this is subject to solid-phase diffusion bonding with the titanium backing plate.

The gadolinium target-titanium backing plate assembly according to the present invention yields superior effects of being able to improve the deposition rate, stabilize the sputtering process, increase the bonding strength between the target material and the backing plate, and thereby prevent the occurrence of warpage and separation of the target material and the backing plate, as well as inhibit the generation of particles during sputtering.

DETAILED DESCRIPTION

A backing plate is demanded to be undeformable against the thermal effect during sputtering the target materials, have superior conductivity of electricity and heat and superior softening resistance behaviors, and be of lightweight. Thus, a copper (copper-alloy) or aluminum (aluminum-alloy) backing plate having favorable thermal conductivity is generally used.

Also when using the gadolinium target of the present invention, a copper (copper-alloy) or aluminum (aluminum-alloy) backing plate having favorable thermal conductivity was used in the initial stage of examination. However, in every case, the bonding strength was low, and there was a problem in that warpage or separation would occur between the target material and the backing plate. It was confirmed that this problem is unique to gadolinium.

Figure 2:
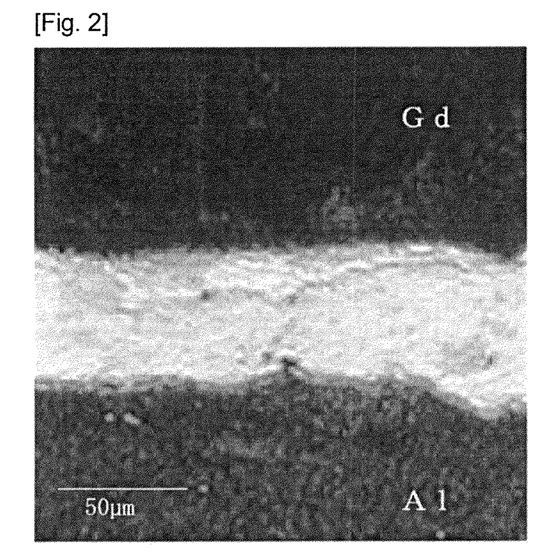
FIG. 2 This is a micrograph of the cross section showing the appearance of the solid-phase diffusion-bonded interface between the aluminum backing plate and the gadolinium target of Comparative Example 1.

Thus, an aluminum backing plate was used to perform solid-phase diffusion bonding with the gadolinium target via HIP, and the interface therebetween was observed. It was confirmed that, at the bonded interface, there is not a layer in which aluminum and gadolinium are simply diffused, but a special layer exists as shown in FIG. 2 of Comparative Example 1 described later. The greater the presence of this layer became (the thicker this layer became), the bonding strength tended to deteriorate. As a result of additional analysis, it was confirmed that this layer is of an intermetallic compound of aluminum and gadolinium.

Figure 3:
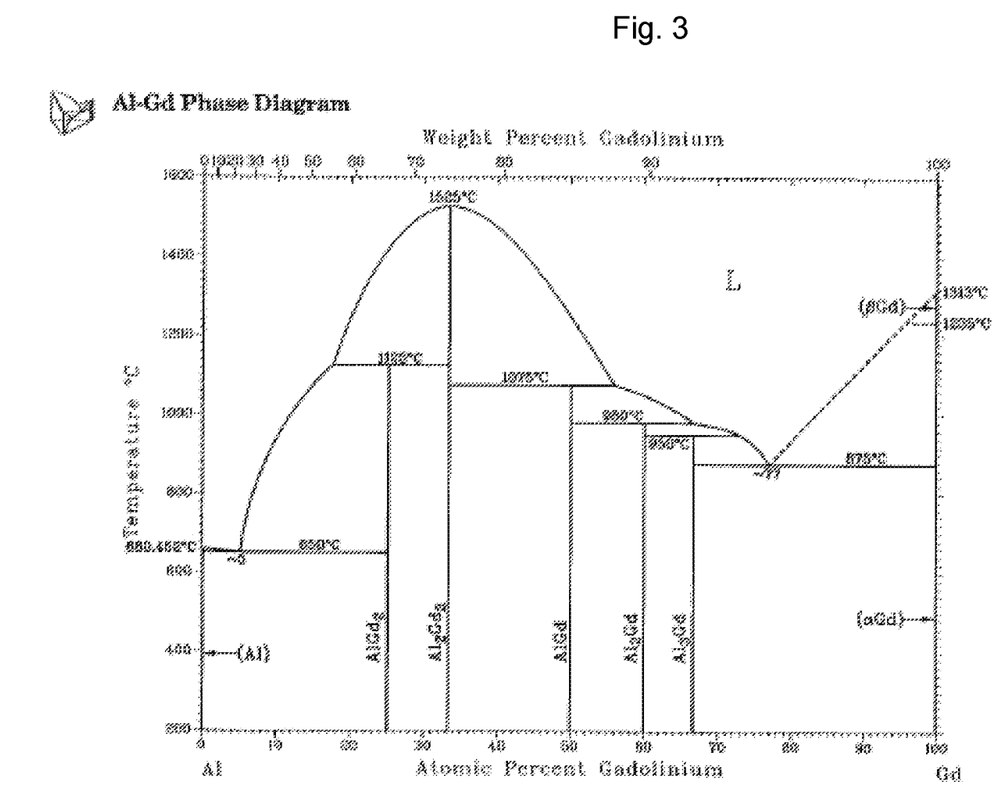
FIG. 3 This is a phase diagram of aluminum and gadolinium (Al—Gd Phase Diagram).
Figure 4:
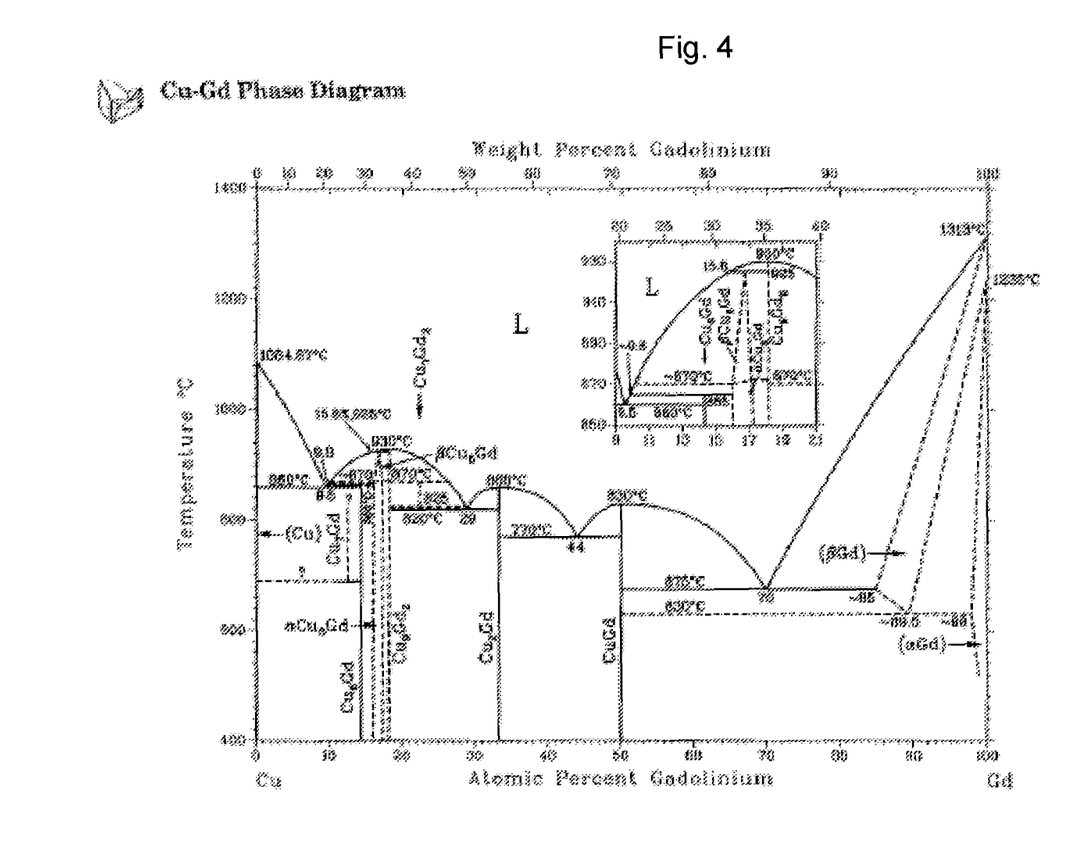
FIG. 4 This is a phase diagram of copper and gadolinium (Cu—Gd Phase Diagram).

Generally speaking, gadolinium as a rare-earth element shows characteristics of high reactivity with metal elements. Accordingly, it was confirmed that it is inappropriate to use a material that forms a highly fragile intermetallic compound at the interface when performing the foregoing diffusion bonding. Thus, the phase diagram of aluminum and copper, which are often used as the backing plate, was examined. The phase diagram of aluminum and gadolinium (Al—Gd Phase Diagram) is shown in FIG. 3, and the phase diagram of copper and gadolinium (Cu—Gd Phase Diagram) is shown in FIG. 4.

Upon reviewing these phase diagrams, numerous phases of the intermetallic compound can be observed between gadolinium and copper or aluminum. In addition, it was confirmed that these phases are fragile phases as shown in the Comparative Examples described later. In the Comparative Examples described later, only an example of the gadolinium target and the aluminum backing plate is illustrated, but the results were the same for the gadolinium target and the copper backing plate. It was confirmed that these consequently deteriorate the bonding strength between the target material and the backing plate, and cause the warpage or separation of the target material and the backing plate.

Thus, the present inventors explored for a backing plate that is suitable for a gadolinium target. As a result, among numerous phase diagrams, the present inventors chose a titanium backing plate to conduct a bonding strength test.

Figure 5:
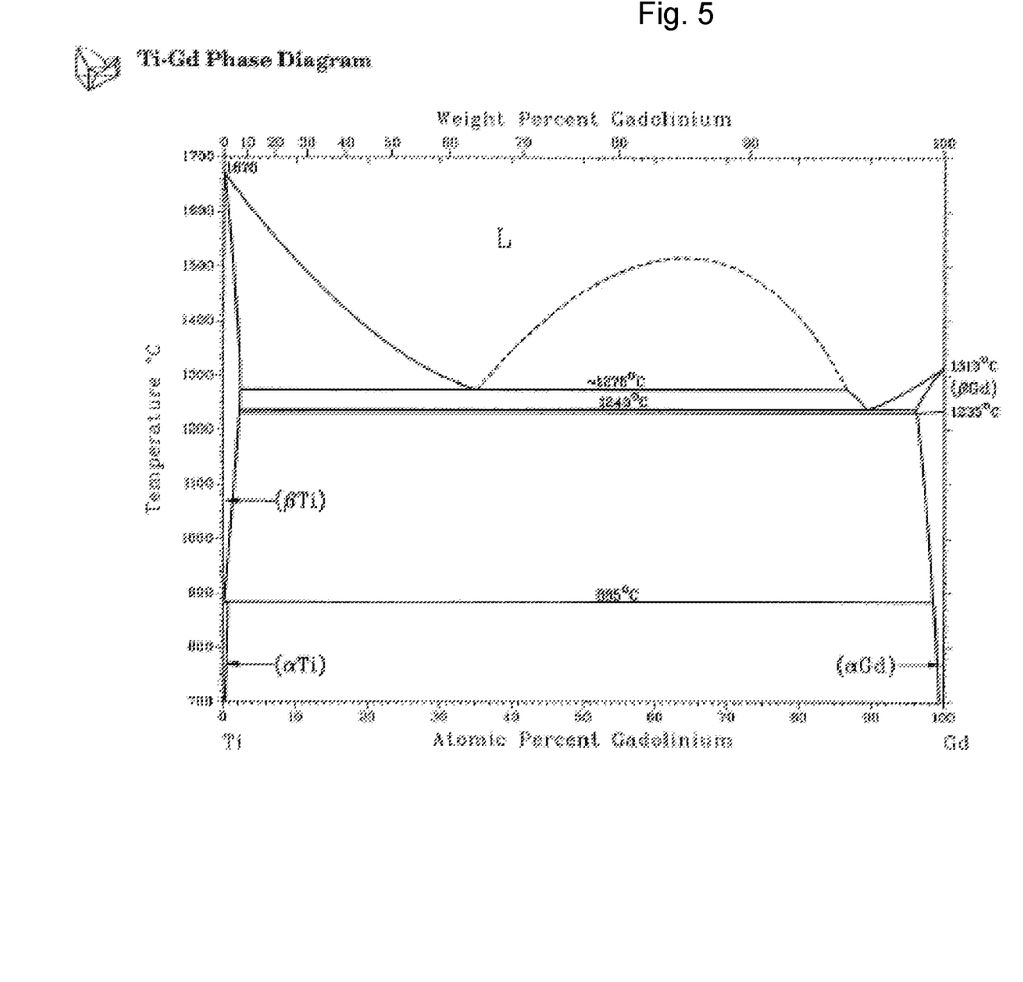
FIG. 5 This is a phase diagram of titanium and gadolinium (Ti—Gd Phase Diagram).

The phase diagram of gadolinium and titanium (Ti—Gd Phase Diagram) is shown in FIG. 5. As shown in FIG. 5, an intermetallic compound is not formed. In addition, upon observing the actual diffusion-bonded interface as shown in Example 1 described later, it was confirmed that an intermetallic compound is not formed.

From the perspective of gadolinium having high reactivity with metal elements, titanium is a rare existence that is suitable for a backing plate. As a result of numerous tests, the present inventors confirmed that titanium is suitable for a backing plate. Since none of the conventional technologies disclose this fact, the novelty and inventive step of the present invention are obvious.

As a result of using a titanium backing plate, it was possible to obtain favorable bonding strength, and prevent the occurrence of warpage and separation of the target material and the backing plate. Moreover, when sputtering was performed using this target-backing plate assembly, the generation of initial particles was low, and a gadolinium film with high uniformity was obtained.

With the gadolinium target-titanium backing plate assembly, for example, a gadolinium target having a purity of 3N or higher and a titanium backing plate having a purity of 4N or higher are used. In order to further increase the strength, the use of a titanium alloy can be considered, but this is undesirable since the alloy components other than titanium cause the formation of intermetallic compounds at the interface. As the titanium of the titanium backing plate, commercially available pure titanium (JIS Type 1 to Type 4) can be used, and product costs can thereby be reduced in the production process.

Titanium is a material having an atomic number of 22, an atomic weight of 47.88, a melting point of 1660° C., a boiling point of 3300° C., density of 4.50 g/cm$^3$ (20° C.), and a linear expansion coefficient of 8.6×10$^{-6}$/K (20° C.). Accordingly, since the linear expansion coefficients of the gadolinium target and the titanium backing plate are similar, it is possible to inhibit the occurrence of warpage and the generation of cracks and fractures in the target caused by the heat during the production or sputtering process.

Since the thermal conductivity of titanium is 21.9 W/m·K, its cooling effect is low as a backing plate in comparison to pure copper. However, there is no particular problem in the characteristics of titanium as a backing plate since it is not oxidized in the air, is chemically stable, and has high strength.

In the way of bonding, for example, a gadolinium target having a purity of 3N or higher and a titanium backing plate having a purity of 4N or higher are subject to solid-phase diffusion bonding under an inert atmosphere at a temperature of 350 to 650° C. and pressure of 1000 to 2000 atm. The diffusion bonding yields considerably higher strength in comparison to using a brazing filler metal such as indium or solder that is generally used upon bonding the target and the backing plate.

In the way of producing the gadolinium target, a preferred production method is as follows; namely, the gadolinium raw material is melted and cast, it is thereafter subject to isothermal forging under an argon atmosphere at a temperature of 1000° C. or less and forging reduction of 60% or higher to prepare a gadolinium ingot, the obtained ingot is sliced to an appropriate thickness, the surface is machined as final-finishing treatment, and this is subject to solid-phase diffusion bonding with the titanium backing plate. Nevertheless, it should be understandable that other production methods may be used se as long as the obtained is a gadolinium target having a purity of 3N or higher.

Since it is possible to prevent the occurrence of warpage and separation of the target material and the backing plate by increasing the bonding strength of the target material and the backing plate, the generation of particles during sputtering can be inhibited. Also, uniformity of the deposition can be ensured.

Moreover, a titanium backing plate has lower thermal conductivity in comparison to a copper or aluminum backing plate, but since it possesses high strength, sputtering can be performed at a high voltage, and the deposition rate can thereby be improved.

EXAMPLES

The Examples are now explained. Note that these Examples are described for facilitating the understanding of the present invention, and are not intended to limit the present invention in any way. In other words, other examples and modifications that fall within the scope of the technical concept of the present invention are all covered by the present invention.

Example 1

A gadolinium target having a purity of 3N or higher was used. The gadolinium of Example 1 contained 45 ppm of Al, 9 ppm of Ca, 32 ppm of Fe, 1 ppm of K, 2.5 ppm of Mg, 5 ppm of Na, 36 ppm of C and 156 ppm of O, with the remainder being Gd and unavoidable impurities. After melting this raw material, the melt was subject to isothermal forging under an Ar atmosphere at a temperature of 1000° C. and forging reduction of 60% to obtain an ingot having a shape of φ 450 mm.

After the ingot was sliced, this was subject to dry-cutting with a lathe, and the surface of the gadolinium target material was subject to finish processing. The following conditions that were considered most optimal were used as the processing conditions. Note that the present invention is not limited in any way based on such processing conditions.
Workpiece rotation speed: 100 rpm
Tool angle: 45°
Feed rate: 0.1 mm/rpm
Final cutting depth: 0.07 mm The gadolinium target that was subject to surface-finishing treatment based on the foregoing conditions was subject to solid-phase diffusion bonding with a titanium backing plate having a purity of 4N. The bonding conditions were as follows.
Temperature: 400° C.
Pressure: 1200 atm
Atmosphere: Ar (inert gas)

The bonding strength of the assembly obtained by the gadolinium target and the titanium backing plate being subject to solid-phase diffusion bonding was 20.6 kgf/mm$^2$ (average value), and favorable results were obtained. Consequently, it was possible to prevent the occurrence of warpage and separation of the target material and the backing plate.

Figure 1:
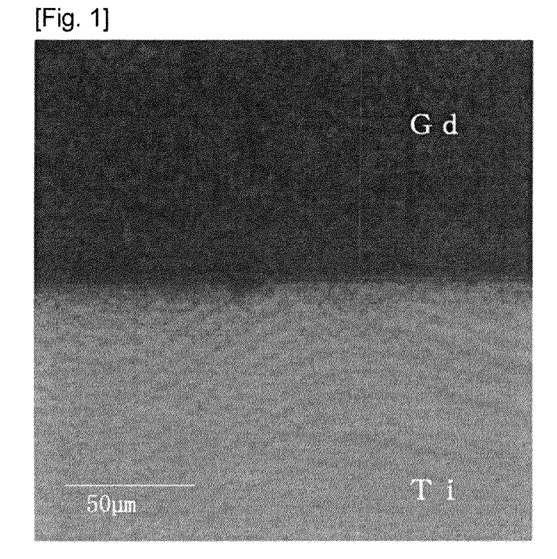
FIG. 1 This is a micrograph of the cross section showing the appearance of the solid-phase diffusion-bonded interface between the titanium backing plate and the gadolinium target of Example 1.

Moreover, as a result of sputtering by using this target-backing plate assembly, the generation of initial particles was low, and it was possible to obtain a gadolinium film having high uniformity. FIG. 1 is an SEM photograph of the cross section of this target-backing plate assembly. It has been confirmed that no intermetallic compound was formed at the interface therebetween.

Comparative Example 1

A gadolinium target having a purity of 3N or higher was used as with Example 1. The gadolinium of Comparative Example 1 contained 45 ppm of Al, 9 ppm of Ca, 32 ppm of Fe, 1 ppm of K, 2.5 ppm of Mg, 5 ppm of Na, 36 ppm of C and 156 ppm of O, with the remainder being Gd and unavoidable impurities. After melting this raw material, the melt was subject to isothermal forging under an Ar atmosphere at a temperature of 1000° C. and forging reduction of 60% to obtain an ingot having a shape of φ 450 mm.

After the ingot was sliced, this was subject to dry-cutting with a lathe, and the surface of the gadolinium target material was subject to finish processing as with Example 1. The gadolinium target that was subject to surface-finishing treatment based on the foregoing conditions was subject to solid-phase diffusion bonding with an aluminum backing plate having a purity of 4N. The bonding conditions were as follows.
Temperature: 400° C.
Pressure: 1000 atm
Atmosphere: Ar (inert gas)

The bonding strength of the assembly obtained by the gadolinium target and the aluminum backing plate being subject to solid-phase diffusion bonding was 8.4 kgf/mm$^2$ (average value), a fragile intermetallic compound of gadolinium and aluminum was formed at the diffusion-bonded interface, and the bonding strength was inferior. Consequently, warpage and separation of the target material and the backing plate occurred.

Moreover, as a result of sputtering by using this target-backing plate assembly, the generation of particles increased, and an inferior gadolinium film was obtained. FIG. 2 is an SEM photograph of the cross section of this target-backing plate assembly. It has been confirmed that an intermetallic compound having a thickness of approximately 80 μm was formed at the interface therebetween.

Example 2

A gadolinium target having a purity of 3N or higher was used. The gadolinium of Example 2 contained 45 ppm of Al, 9 ppm of Ca, 32 ppm of Fe, 1 ppm of K, 2.5 ppm of Mg, 5 ppm of Na, 36 ppm of C and 156 ppm of O, with the remainder being Gd and unavoidable impurities. After melting this raw material, the melt was subject to isothermal forging under an Ar atmosphere at a temperature of 900° C. and forging reduction of 60% to obtain an ingot having a shape of φ 450 mm.

After the ingot was sliced, this was subject to dry-cutting with a lathe, and the surface of the gadolinium target material was subject to finish processing. The following conditions that were considered most optimal were used as the processing conditions. Note that the present invention is not limited in any way based on such processing conditions.
Workpiece rotation speed: 100 rpm
Tool angle: 45°
Feed rate: 0.1 mm/rpm
Final cutting depth: 0.07 mm The gadolinium target that was subject to surface-finishing treatment based on the foregoing conditions was subject to solid-phase diffusion bonding with a titanium backing plate having a purity of 4N. The bonding conditions were as follows.
Temperature: 600° C.
Pressure: 1000 atm
Atmosphere: Ar (inert gas)

The bonding strength of the assembly obtained by the gadolinium target and the titanium backing plate being subject to solid-phase diffusion bonding was 31.5 kgf/mm² (average value), and favorable results were obtained. Consequently, it was possible to prevent the occurrence of warpage and separation of the target material and the backing plate.

Moreover, as a result of sputtering by using this target-backing plate assembly, the generation of initial particles was low, and it was possible to obtain a gadolinium film having high uniformity. Formation of an intermetallic compound at the interface was not observed.

Comparative Example 2

A gadolinium target having a purity of 3N or higher was used as with Example 1. The gadolinium of Comparative Example 2 contained 45 ppm of Al, 9 ppm of Ca, 32 ppm of Fe, 1 ppm of K, 2.5 ppm of Mg, 5 ppm of Na, 36 ppm of C and 156 ppm of O, with the remainder being Gd and unavoidable impurities. After melting this raw material, the melt was subject to isothermal forging under an Ar atmosphere at a temperature of 1000° C. and forging reduction of 60% to obtain an ingot having a shape of φ 450 mm.

After the ingot was sliced, this was subject to dry-cutting with a lathe, and the surface of the gadolinium target material was subject to finish processing as with Example 1.

The gadolinium target that was subject to surface-finishing treatment based on the foregoing conditions was subject to solid-phase diffusion bonding with a copper (OFC: oxygen-free copper) backing plate. The bonding conditions were as follows.
Temperature: 400° C.
Pressure: 1000 atm
Atmosphere: Ar (inert gas)

The bonding strength of the assembly obtained by the gadolinium target and the copper (OFC: oxygen-free copper) backing plate being subject to solid-phase diffusion bonding was 5.8 kgf/mm² (average value), a fragile intermetallic compound of gadolinium and copper was formed at the diffusion-bonded interface, and the bonding strength was inferior. Consequently, warpage and separation of the target material and the backing plate occurred.

Moreover, as a result of sputtering by using this target-backing plate assembly, the generation of particles increased, and an inferior gadolinium film was obtained.

Comparative Example 3

A gadolinium target having a purity of 3N or higher was used as with Example 1. The gadolinium of Comparative Example 3 contained 45 ppm of Al, 9 ppm of Ca, 32 ppm of Fe, 1 ppm of K, 2.5 ppm of Mg, 5 ppm of Na, 36 ppm of C and 156 ppm of O, with the remainder being Gd and unavoidable impurities. After melting this raw material, the melt was subject to isothermal forging under an Ar atmosphere at a temperature of 1000° C. and forging reduction of 60% to obtain an ingot having a shape of φ 450 mm.

After the ingot was sliced, this was subject to dry-cutting with a lathe, and the surface of the gadolinium target material was subject to finish processing as with Example 1. The gadolinium target that was subject to surface-finishing treatment based on the foregoing conditions was subject to solid-phase diffusion bonding with a titanium backing plate having a purity of 4N. The bonding conditions were as follows.
Temperature: 300° C.
Pressure: 1000 atm
Atmosphere: Ar (inert gas)

Bonding of the gadolinium target and the titanium backing plate was insufficient, and separation occurred from the interface during the preparation of the tensile test piece.

The gadolinium target-titanium backing plate assembly according to the present invention yields superior effects of being able to improve the deposition rate, stabilize the sputtering process, increase the bonding strength between the target material and the backing plate, and thereby prevent the occurrence of warpage and separation of the target material and the backing plate, as well as inhibit the generation of particles during sputtering. Consequently, the present invention yields superior effects of being able to efficiently and stably provide electronic components using thin films, which have gadolinium as a main component and are obtained using the foregoing gadolinium target.

The invention claimed is:
1. An assembly comprising a gadolinium target plate and a titanium backing plate bonded to the gadolinium target plate, the gadolinium target plate being defined by an exposed sputtering face and an opposing non-sputtering face and having a diameter of at least 450 mm, and the titanium backing plate being defined by a face which is in contact with and bonded to the non-sputtering face of the gadolinium target plate and an opposed face which forms an exposed rear face of said assembly, wherein the gadolinium target plate has a purity of 99.9% or higher and the titanium backing plate has a purity of 99.99% or higher, the non-sputtering face of the gadolinium target plate and the face of the titanium backing plate in contact with the non-sputtering face of the gadolinium target plate are bonded to each other by solid-phase diffusion bonding to provide a bonding interface.

2. A method of producing a gadolinium target and titanium backing plate assembly, comprising the step of subjecting a gadolinium target plate of 99.9% (3N) or higher purity and a titanium backing plate of 99.99% (4N) or higher purity to solid-phase diffusion bonding under an inert atmosphere at a temperature of 350 to 650° C. and pressure of 1000 to 2000 atm to provide a bonding interface, wherein the gadolinium target plate has an exposed sputtering face and an opposing non-sputtering face and has a diameter of at least 450 mm, the titanium backing plate has a face which is in contact with and bonded to the non-sputtering face of the gadolinium target plate and an opposed face which forms an exposed rear face of said assembly.

3. A method of producing a gadolinium target plate and titanium backing plate assembly, comprising the steps of subjecting gadolinium of 99.9% (3N) or higher purity to isothermal forging under an argon atmosphere at a temperature of 1000° C. or less and forging reduction of 60% or higher to prepare a gadolinium ingot, slicing the obtained ingot to an appropriate thickness to prepare a gadolinium target plate, machining a surface of the gadolinium target plate as final-finishing treatment, and subjecting the gadolinium target plate to solid-phase diffusion bonding with a titanium backing plate of 99.99% (4N) or higher purity to provide a bonding interface, wherein the gadolinium target plate has an exposed sputtering face and an opposing non-sputtering face and has a diameter of at least 450 mm, the titanium backing plate has a face which is in contact with and bonded to the non-sputtering face of the gadolinium target plate and an opposed face which forms an exposed rear face of said assembly.

4. An assembly consisting of a sputtering target bonded to a backing plate, said sputtering target consisting of gadolinium metal of 99.9% (3N) or higher purity having a diameter of at least 450 mm, said backing plate consisting of titanium metal of 99.99% (4N) or higher purity, and a bonding interface therebetween being a solid-phase diffusion-bonded interface without intermetallic compound, wherein the assembly includes an exposed sputtering face provided by the gadolinium metal and an opposite exposed backing plate face provided by the titanium metal.

5. An assembly according to claim 4, wherein a bonding strength of the solid-phase diffusion-bonded interface is 20.6 to 31.5 kgf/mm$^2$.

6. An assembly according to claim 1, wherein a bonding strength of the bonding interface is 20.6 to 31.5 kgf/mm$^2$.

* * * * *